US010288675B2

(12) United States Patent
Parker et al.

(10) Patent No.: US 10,288,675 B2
(45) Date of Patent: May 14, 2019

(54) REMOTE DIAGNOSTIC SYSTEM AND METHOD FOR CIRCUIT PROTECTION DEVICES SUCH AS MINIATURE CIRCUIT BREAKERS

(71) Applicant: Eaton Corporation, Cleveland, OH (US)

(72) Inventors: Kevin Lynn Parker, Pittsburgh, PA (US); David Austin Eldridge, Knoxville, TN (US); Christopher Stuart, East Lansing, MI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 908 days.

(21) Appl. No.: 14/109,467

(22) Filed: Dec. 17, 2013

(65) Prior Publication Data

US 2015/0168487 A1 Jun. 18, 2015

(51) Int. Cl.
*G01R 31/28* (2006.01)
*H02H 1/00* (2006.01)
*G01R 31/327* (2006.01)
*H01H 71/00* (2006.01)

(52) U.S. Cl.
CPC ....... *G01R 31/2837* (2013.01); *G01R 31/327* (2013.01); *H02H 1/0007* (2013.01); *H02H 1/0053* (2013.01); *H02H 1/0061* (2013.01); *H01H 2071/006* (2013.01)

(58) Field of Classification Search
CPC .............. G01R 31/2837; G01R 31/327; H02H 1/0053; H02H 1/0061; H02H 1/0007; H01H 2071/006
See application file for complete search history.

(56) References Cited

U.S. PATENT DOCUMENTS

| 4,428,022 A | 1/1984 | Engel et al. |
| 5,525,985 A | 6/1996 | Schlotterer et al. |
| 5,910,760 A | 6/1999 | Malingowski et al. |

(Continued)

OTHER PUBLICATIONS

KURONO, "Technical Trend and Problem toward Field Sensor Network Construction of Power System Maintenance" by KURONO, in KEISO (Instrumentation), vol. 53, No. 7, p. 36-41, Jul. 2010, 9 pp., from corresponding JP application No. 2016-541078 (no English language translation available).

(Continued)

*Primary Examiner* — Mohamed Charioui
*Assistant Examiner* — Jeremy A Delozier
(74) *Attorney, Agent, or Firm* — Eckert Seamans (57) ABSTRACT

A system for diagnosing circuit protection device field issues includes a remote computer system and a diagnostic circuit protection device installed at a customer location, wherein the circuit protection device includes a processor configured to execute a number of routines, a plurality of sensors structured to sense power circuit information, a memory accessible by the processor, and a communications module coupled to the non-volatile memory. The routines are structured to input sensed power circuit information and determine trip information for one or more trip cycles and cause the stored power circuit information and trip information to be transmitted to the remote computer system by the communications module over a network for storage and subsequent access for diagnostic purposes.

13 Claims, 6 Drawing Sheets

(56) References Cited

U.S. PATENT DOCUMENTS

| | | | | |
|---|---|---|---|---|
| 6,144,271 | A | * | 11/2000 | Mueller ............ H01H 71/0228 335/167 |
| 2006/0176630 | A1 | | 8/2006 | Carlino et al. |
| 2007/0086131 | A1 | * | 4/2007 | Miller ...................... H01F 3/12 361/62 |
| 2010/0187081 | A1 | | 7/2010 | Naumann et al. |
| 2011/0181124 | A1 | | 7/2011 | Uesaka |
| 2013/0329331 | A1 | * | 12/2013 | Erger .................. H02H 1/0084 361/102 |
| 2014/0226248 | A1 | * | 8/2014 | Hameed .................. H02H 1/00 361/115 |

OTHER PUBLICATIONS

European Patent Office, "International Search Report and Written Opinion for PCT/US2014/065127", dated Mar. 6, 2015, 13 pp.

* cited by examiner

REMOTE DIAGNOSTIC SYSTEM AND METHOD FOR CIRCUIT PROTECTION DEVICES SUCH AS MINIATURE CIRCUIT BREAKERS

BACKGROUND

Field

The disclosed concept pertains generally to circuit interrupters and, more particularly, to a remote diagnostic system and method for circuit protection devices such as an arc fault circuit interrupter (AFCI).

Background Information

Circuit interrupters, such as circuit breakers, are generally old and well known in the art. Circuit breakers are used to protect electrical circuitry from damage due to an overcurrent condition, such as an overload condition or a relatively high level short circuit or fault condition. In small circuit breakers used for residential and light commercial applications, commonly referred to as miniature circuit breakers, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Industrial circuit breakers often use a circuit breaker frame, which houses a trip unit. See, for example, U.S. Pat. Nos. 5,910,760; and 6,144,271. The trip unit may be modular and may be replaced, in order to alter the electrical properties of the circuit breaker.

It is well known to employ trip units which utilize a microprocessor to detect various types of overcurrent trip conditions and provide various protection functions, such as, for example, a long delay trip, a short delay trip, an instantaneous trip, and/or a ground fault trip. The long delay trip function protects the load served by the protected electrical system from overloads and/or overcurrents. The short delay trip function can be used to coordinate tripping of downstream circuit breakers in a hierarchy of circuit breakers. The instantaneous trip function protects the electrical conductors to which the circuit breaker is connected from damaging overcurrent conditions, such as short circuits. As implied, the ground fault trip function protects the electrical system from faults to ground.

The earliest electronic trip unit circuit designs utilized discrete components such as transistors, resistors and capacitors.

More recently, designs, such as disclosed in U.S. Pat. Nos. 4,428,022 and 5,525,985, have included microprocessors, which provide improved performance and flexibility. These digital systems sample the current waveforms periodically to generate a digital representation of the current. The microprocessor uses the samples to execute algorithms, which implement one or more current protection curves.

When diagnosing field issues with a miniature circuit breaker such as an arc fault circuit interrupter (AFCI), engineers often rely heavily on hearsay reports of the circumstances surrounding each issue. These reports can come from users, electricians and sales staff. Although the people providing the information are certainly well-intentioned and their efforts are greatly appreciated, the quality of information that gets reported back from the field is often of poor or questionable value. In fact, assessing the quality of information provided from field reports is often as big a challenge as determining what the original problem may have been.

When the pattern of available information is confusing or unclear, engineers are forced to make very broad guesses as to what the field issue may have been. Hence, diagnosing a field issue is difficult with little solid information to help diagnose the issue. In these cases, it is often necessary to send a circuit interrupter design/development engineer to a field location along with oscilloscopes and other diagnostic equipment in order to collect additional firsthand information about the issue. This can be time consuming, costly and even unproductive if the field issue is not readily repeatable.

In known miniature circuit breakers, the information that the circuit breaker uses to make each trip decision is lost because there is no comprehensive storage mechanism. For example, a known AFCI microprocessor stores only a single byte of information (i.e., the "cause-of-trip") in its internal data EEPROM per trip event. This is because of various restrictions.

The highest priority of an AFCI is to interrupt the protected circuit whenever an exceptional condition is suspected. The processor cannot delay circuit interruption in order to store information. Hence, the microprocessor stores a "cause-of-trip" in the EEPROM only after a fault has been identified and a signal has been sent to trip open the circuit breaker operating mechanism. Also, there is a limited time after the AFCI interrupts the protected circuit for the processor to store information. This is because the AFCI uses power provided by the utility source, which is interrupted when the circuit breaker separable contacts open. For example, the time required to store information in the EEPROM is relatively large (e.g., about 5 to 10 milliseconds (mS)) when compared to the power supply hold time, such that only a single byte of information can be reliably saved for each trip event.

Another problem associated with EEPROM is that the single AFCI microprocessor may stop executing code while information is being written to its EEPROM. As a consequence, the processor does not write to EEPROM any time it is looking for faults. Otherwise, if this were allowed, then the microprocessor would be "blind" to arc fault conditions each time that it stored data. Furthermore, restrictions on the number of write cycles of EEPROM (e.g., 300,000 maximum write cycles) mean that a limited amount of information can be stored in EEPROM.

A known first generation combination circuit breaker provides protection for parallel arcs, series arcs and 30 mA ground faults. This employs a processor, provides a single trip record containing one byte of information (i.e., the most recent cause-of-trip) in data EEPROM for data logging, and provides for extraction of the cause-of-trip by connecting a third party EEPROM development tool directly to the circuit breaker printed circuit board, but does not provide user communications. The cause-of-trip information is not available to the user.

A known second generation combination circuit breaker provides improved protection for parallel arcs and series arcs, and optionally 30 mA ground faults. This employs a processor, provides several hundred trip records, each record containing one byte of information indicating a cause-of-trip for each trip event in data EEPROM for data logging, and provides for extraction of the cause-of-trip by an optional blinking LED, but only for the most recent trip event. A status log of the full trip history is available by connecting a proprietary tool directly to the circuit breaker printed circuit board, but is not available to the user.

The assignee of the present invention has developed a next generation circuit breaker that employs a "black box" in a miniature circuit breaker in order to improve the quantity and quality of information available when diagnosing, for example, AFCI issues encountered in the field. This next generation circuit breaker is described in U.S. patent application Ser. No. 13/608,495, filed Sep. 10, 2012 and entitled "Circuit Interrupter Employing Non-Volatile Memory for Improved Diagnostics", the disclosure of which is incorporated herein by reference. More specifically, that application describes a miniature circuit breaker that includes separable contacts, an operating mechanism structured to open and close the separable contacts, a trip mechanism cooperating with the operating mechanism to trip open the separable contacts, a processor having firmware, a plurality of sensors sensing power circuit information operatively associated with the separable contacts, and a non-volatile memory accessible by the processor. The firmware of the processor is structured to input the sensed power circuit information, determine and store trip information for each of a plurality of trip cycles in the non-volatile memory, store the sensed power circuit information in the non-volatile memory for each of a plurality of line half-cycles, and determine and store circuit breaker information in the non-volatile memory for the operating life span of the miniature circuit breaker.

Notwithstanding the foregoing, there remains room for improvement in circuit interrupters, such as miniature circuit breakers. In particular, there is room for improvement in the diagnosis of field issues to, for example, address the frequent need to send a costly design engineer to a field location in order to collect firsthand information about the issue.

SUMMARY

In one embodiment, a method of remotely diagnosing field issues associated with a trip of a circuit protection device at a customer location is provided. The method includes receiving notice of a potential field issue at the customer location, providing a diagnostic circuit protection device for the customer, wherein the diagnostic circuit protection device is installed at the customer location between an electrical system and a load having one or more branch electrical circuits, wherein the circuit protection device includes a plurality of sensors structured to sense power circuit information associated with one or both of the electrical system and the one or more branch electrical circuits, and a non-volatile memory, inputting and storing the sensed power circuit information and determining and storing trip information for one or more trip cycles of the diagnostic circuit protection device in the non-volatile memory, and transmitting the stored power circuit information and trip information to a remote computer system, the stored power circuit information and trip information being stored by the remote computer system for subsequent access thereto for diagnosing the potential field issue.

In another embodiment, a system for remotely diagnosing field issues associated with a trip of a circuit protection device at a customer location is provided. The system includes a diagnostic circuit protection device installed at the customer location between an electrical system and a load having one or more branch electrical circuits, wherein the circuit protection device includes a processor configured to execute a number of routines, a plurality of sensors structured to sense power circuit information associated with one or both of electrical system and the one or more branch electrical circuits, a non-volatile memory accessible by the processor, and a communications module coupled to the non-volatile memory. The system also includes a remote computer system. The number of routines are structured to input and store the sensed power circuit information and determine and store trip information for one or more trip cycles of the diagnostic circuit protection device in the non-volatile memory and cause the stored power circuit information and trip information to be transmitted to the remote computer system by the communications module over a network for storage and subsequent access for diagnostic purposes.

In still another embodiment, a diagnostic circuit protection device for remotely diagnosing field issues associated with a circuit protection device trip at a customer location is provided. The diagnostic circuit protection device is structured to be installed at the customer location between an electrical system and a load having one or more branch electrical circuits. The diagnostic circuit protection device includes a processor configured to execute a number of routines, a plurality of sensors structured to sense power circuit information associated with one or both of electrical system and the one or more branch electrical circuits, a non-volatile memory accessible by the processor, and a communications module coupled to the non-volatile memory. The number of routines are structured to input and store the sensed power circuit information and determine and store trip information for one or more trip cycles of the diagnostic circuit protection device in the non-volatile memory and cause the stored power circuit information and trip information to be transmitted to a remote computer system by the communications module over a network for storage and subsequent access for diagnostic purposes.

In yet another embodiment, a method of remotely diagnosing field issues associated with a trip of a circuit protection device at a customer location is provided. The method includes providing a diagnostic circuit protection device for the customer, wherein the diagnostic circuit protection device is installed at the customer location between an electrical system and a load having one or more branch electrical circuits, wherein the diagnostic circuit protection device includes a plurality of sensors structured to sense power circuit information associated with one or both of the electrical system and the one or more branch electrical circuits, and a non-volatile memory, inputting and storing the sensed power circuit information and determining and storing trip information for one or more trip cycles of the diagnostic circuit protection device in the non-volatile memory, and transmitting the stored power circuit information and trip information to a remote computer system, the stored power circuit information and trip information being stored by the remote computer system for subsequent access thereto for diagnosing a potential field issue.

In yet another alternative embodiment, a method of remotely diagnosing field issues associated with a trip of a circuit protection device at a customer location is provided. The method includes providing a diagnostic device for the customer, wherein the diagnostic device is installed at the customer location between an electrical system and a load having one or more branch electrical circuits by coupling the diagnostic device to the circuit protection device, wherein the circuit protection device includes a plurality of sensors structured to sense power circuit information associated with one or both of the electrical system and the one or more branch electrical circuits, and a non-volatile memory, inputting and storing the sensed power circuit information and determining and storing trip information for one or more trip cycles of the circuit protection device in the non-volatile memory, and transmitting the stored power circuit information and trip information to a remote computer system using the diagnostic device, the stored power circuit information and trip information being stored by the remote computer system for subsequent access thereto for diagnosing the potential field issue.

In still another alternative embodiment, a diagnostic device for remotely diagnosing field issues associated with a trip of a circuit protection device at a customer location is provided. The diagnostic device includes a processing device, a memory, and a communications module. The diagnostic device is structured and configured to be installed at the customer location between an electrical system and a load having one or more branch electrical circuits by coupling the diagnostic device to the circuit protection device. The circuit protection device includes a plurality of sensors structured to sense power circuit information associated with one or both of the electrical system and the one or more branch electrical circuits, wherein the circuit protection device is structured and configured to store the sensed power circuit information and determine and store trip information for one or more trip cycles of the circuit protection device, wherein the processing device and memory are structured and configured to cause the communications module to transmit the stored power circuit information and trip information to a remote computer system, the stored power circuit information and trip information being stored by the remote computer system for subsequent access thereto for diagnosing the potential field issue.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "connected" or "coupled" together shall mean that the parts are joined together either directly or joined through one or more intermediate parts.

As employed herein, the term "operating life span" shall mean the duration of operating existence of a circuit interrupter with suitable power applied to its line terminal(s).

The disclosed concept is described in association with single pole miniature circuit breakers, although the disclosed concept is applicable to a wide range of circuit interrupters having any number of poles.

Figure 1:
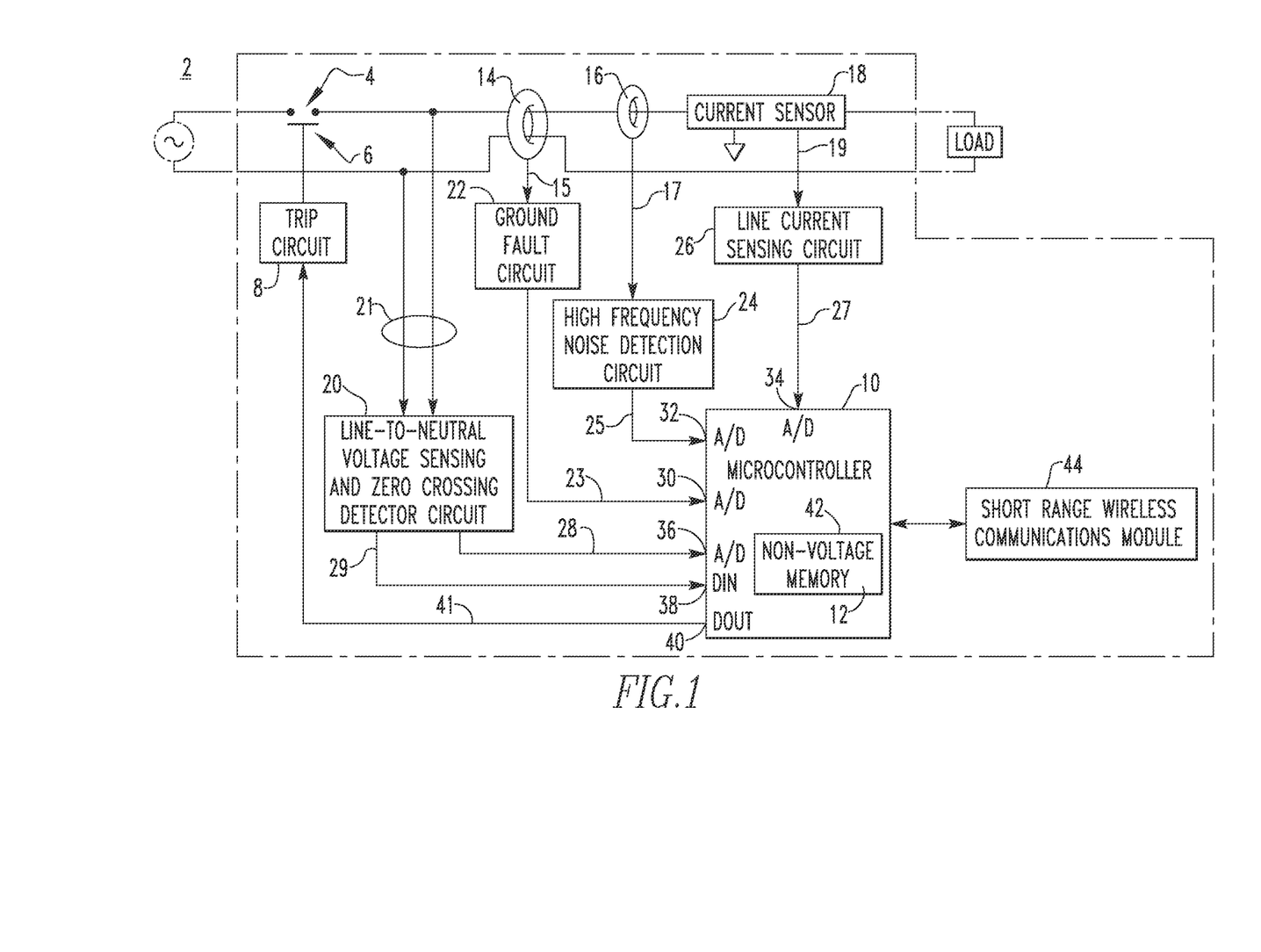
FIG. 1 is a block diagram of a miniature circuit breaker according to one exemplary embodiment of the disclosed concept.

FIG. 1 is a block diagram of an example miniature circuit breaker 2 according to one exemplary embodiment. Miniature circuit breaker 2 is an AFCI and, as described in greater detail elsewhere herein (FIGS. 3 and 6), is used to implement a remote diagnostic system according to an aspect of the present invention. The example miniature circuit breaker 2 is similar to the miniature circuit breaker described in the above-mentioned U.S. patent application Ser. No. 13/608, 495. However, as described in greater detail herein, miniature circuit breaker 2 of the present embodiment further includes wireless communications functionality to enable data obtained and stored by miniature circuit breaker 2 to be transmitted to a remote location as part of the described remote diagnostic system.

Referring to FIG. 1, miniature circuit breaker 2 has an operating life span and includes separable contacts 4, an operating mechanism 6 structured to open and close the separable contacts 4, a trip mechanism, such as the example trip circuit 8, cooperating with the operating mechanism 6 to trip open the separable contacts 4, and a processor, such as the example microcontroller 10, having a number of routines 12. Although separable contacts 4 are shown in the illustrated embodiment, any suitable solid state separable contacts can be employed. For example, while the illustrated miniature circuit breaker 2 includes a suitable circuit interrupter mechanism in the form of separable contacts 4 that are opened and closed by the operating mechanism 6, the disclosed concept is applicable to a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms).

Miniature circuit breaker 2 also includes a plurality of sensors 14, 16, 18, 20 to sense power circuit information operatively associated with the separable contacts 4. For example, and without limitation, the example sensors include a ground fault sensor 14, a broadband noise sensor 16, a current sensor 18, and a line-to-neutral voltage sensing and zero crossing detector circuit 20. The output 15 of the ground fault sensor 14 is input by a ground fault circuit 22 that outputs a ground fault signal 23 to the microcontroller 10. The output 17 of the broadband noise sensor 16 is input by a high frequency noise detection circuit 24 that outputs a high frequency detector signal 25 to the microcontroller 10. The output 19 of the current sensor 18 is input by a line current sensing circuit 26 that outputs a line current signal 27 to the microcontroller 10. The input 21 of the voltage sensing and zero crossing detector circuit 20 is a line-to-neutral voltage. In turn, the circuit 20 outputs a line voltage signal 28 and a line voltage zero crossing signal 29 to the microcontroller 10. The microcontroller 10 includes analog inputs 30, 32, 34, 36 for the respective analog signals 23, 25, 27, 28, and a digital input 38 for the digital line voltage zero crossing signal 29. The analog inputs 30, 32, 34, 36 are operatively associated with a number of analog-to-digital converters (ADCs) (not shown) within the microcontroller 10. The microcontroller 10 also includes a digital output 40 that provides a trip signal 41 to the trip circuit 8.

Miniature circuit breaker 2 further includes a non-volatile memory 42 accessible thereby. The non-volatile memory 42 may be external to (not shown) or internal to (as shown) the microcontroller 10. The routines 12 of the microcontroller 10, which may be stored by the non-volatile memory 42 (as shown) or by another suitable memory (not shown), are, in the exemplary embodiment, structured to input the sensed power circuit information from the various sensors 14, 16, 18, 20, determine and store trip information for each of a plurality of trip cycles in the non-volatile memory 42, store the sensed power circuit information in the non-volatile memory 42 for each of a plurality of line half-cycles, and determine and store circuit breaker information in the non-volatile memory 42 for the operating life span of the miniature circuit breaker 2. A number of particular implementations of the routines 12 executed by the microcontroller 10 for providing the above-described functionality are described in detail in the above-mentioned U.S. patent application Ser. No. 13/608,495 (FIGS. 2A-3D thereof), which is incorporated herein by reference. Thus, those particular routine implementations will not be described in detail herein, although it will be appreciated that they may be employed in connection with the present invention. Such routines may include an initialization routine, a main loop routine, an interrupt routine, a trip routine and an optional arc fault/ground fault protection routine.

As seen in FIG. 1, miniature circuit breaker 2 also further includes a short range wireless communications module 44. Short range wireless communications module 44 is a module that is structured and configured to enable miniature circuit breaker 2 to communicate with other, similarly equipped electronic devices over a short range wireless network. For example, and as described elsewhere herein, short range wireless communications module 44 is structured and configured to enable miniature circuit breaker 2 to communicate with a wireless access point in order to gain access to a network, such as the Internet, for linking and communicating with a remote computer system. In the exemplary embodiment, short range wireless communications module 44 is a WiFi enabled module permitting communication of data over a WiFi network to, for example, a WiFi wireless router according to the Institute of Electrical and Electronics Engineers (IEEE) 802.11 standards. In one particular implementation, wireless communications module 44 is the hardware module commercially available from Electric Imp (www.electricimp.com) that includes a processor running a proprietary OS and an 802.11b/g/n WiFi radio. Alternatively, short range wireless communications module 44 may be a Bluetooth® module that is structured and configured to enable miniature circuit breaker 2 to communicate with other devices, such as a wireless access point, over an ad hoc Bluetooth® network. Other suitable alternatives include 802.11ac, 802.15.4, Zigbee/Zwave, and transmitting data over the Internet/to the Cloud using HTTP, TCP/IP. In still another alternative, wireless communications module 44 may be replaced by a long range wireless communications module (such as a modem), that is structured and configured to enable miniature circuit breaker 2 to communicate with a remote computer system over a suitable network, such as the Internet. In yet another alternative, wireless communications module 44 may be replaced by wired connection that is structured and configured to enable miniature circuit breaker 2 to communicate with a remote computer system over a suitable network, such as the Internet. Thus, as used herein, a wireless communications module shall refer to any suitable mechanism, device or component (or portion thereof) that is structured and configured to enable miniature circuit breaker 2 to communicate with a remote computer system over a suitable network.

Exemplary, non-limiting data storage operation of miniature circuit breaker 2 according to a number of embodiments will now be described in detail. The example microcontroller 10, which can perform AFCI functions, stores information continuously, without hindering circuit protection, and also stores a relatively large quantity of information about each trip decision. This information, as stored by the microcontroller 10, constitutes information from a known source and of a known quality, which is useful for diagnosing field issues. Thus, as discussed elsewhere herein (FIGS. 3 and 6), this information is able to be used in a remote diagnostic system to better serve customers in diagnosing field issues.

The example microcontroller 10 includes the example internal non-volatile memory 42 provided by, for example and without limitation, ferroelectric random-access memory (FRAM). When compared with conventional data EEPROM non-volatile memory, FRAM has a faster write performance (e.g., $125*10^{-9}$ seconds per write versus $5*10^{-3}$ seconds per write) and a much greater maximum number of write-erase cycles ($10^{15}$ versus $10^6$). Using FRAM capability will not necessarily improve the protection functions of the microcontroller 10; however, it allows continuous data storage, which could lead to much more extensive diagnostics as described in the examples below.

EXAMPLE 1

Maintaining a count of line half-cycles in non-volatile memory 42 allows measuring the duration between events. For instance, counting half-cycles allows the following to be captured: (1) the total number of line half-cycles that the miniature circuit breaker 2 was energized during its life span; and (2) the line half-cycles from when the miniature circuit breaker 2 was powered on to when it tripped, for each trip event.

EXAMPLE 2

For a data capture application, a processor with FRAM non-volatile memory as just described, such as microcontroller 10 and non-volatile memory 42 of miniature circuit breaker 2, can store data continuously without regard to a write-erase cycle limit. This can capture historical data, such as, for example and without limitation: (1) an "oscilloscope"-like internal function, which captures several line half-cycles of sampled analog and/or digital data (e.g., without limitation, line current; high frequency detector output; line voltage; line voltage zero crossing; ground fault signal; line half-cycle and interrupt counts, which helps capture the order in which the data occurred and also the phase information of the data relative to the utility voltage) prior to a trip; if adequate memory is available, the processor can store an "oscilloscope capture" of sampled analog data seen prior to the last several trip events; and (2) either a snapshot or a history of key processor registers and/or key algorithm variables that preceded each trip.

Figure 2:
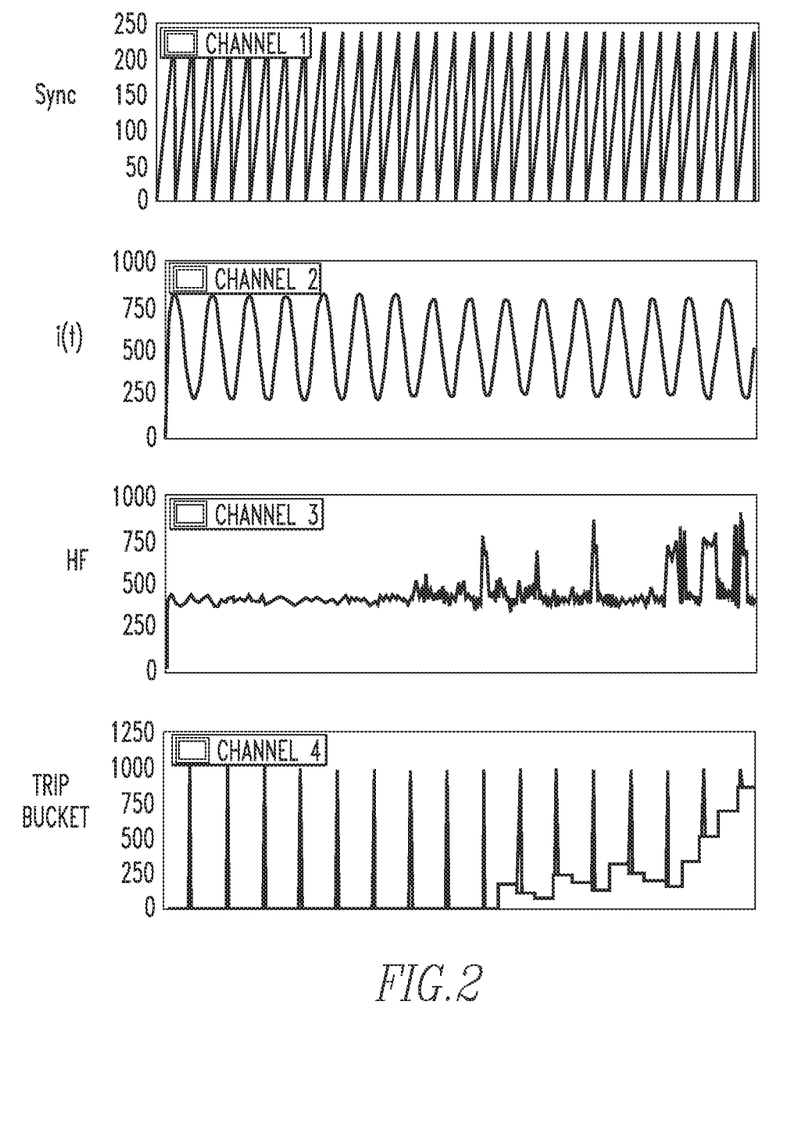
FIG. 2 shows exemplary "oscilloscope"-like data that may be captured and stored by the miniature circuit breaker of FIG. 1.

For example, as shown in FIG. 2, the following "oscilloscope"-like data may be captured and stored by miniature circuit breaker 2 so that it may subsequently be represented in graphical form to, for example, a designer/developer for diagnostic purposes: (i) "Synch" data; (ii) "i(t)" data, (iii) "HF" data, and (iv) "Trip Bucket" data. With respect to the "Synch" data, in the exemplary embodiment, microcontroller 10 interrupts 16 times per each half-cycle of the utility sinusoidal voltage. The "Synch" sawtooth wave represents the interrupt numbers 0 through 15. Direct observation of the sawtooth wave allows a designer/developer to verify that (1) the proper number of interrupts occur per half-cycle, (2) the interrupt durations are consistent, and (3) the interrupts are in fact synchronous with the line voltage. Regarding (2), it should be noted that "direct observation" in the exemplary embodiment means measuring an analog version of the sawtooth waveform that represents the interrupt operation in real-time with an oscilloscope. This kind of analysis allows a developer to identify timing issues by looking for irregularities in the waveform displayed by the oscilloscope. Note that the web page display of oscilloscope-type data would not reveal timing abnormalities unless the time duration between interrupts was also captured, stored, transmitted to the web page and used in graphing the waveforms, which may be the case in an alternative exemplary embodiment. With respect to the "i(t)" data, in the exemplary embodiment, this is the current on the branch circuit protected by miniature circuit breaker 2 as read by microcontroller 10. With respect to the "HF" data, in the exemplary embodiment, this is the output of high frequency noise detection circuit 24, that is responsive to high frequency noise on the branch circuit protected by miniature circuit breaker 2. Arcs produce high frequency noise, and all the manufacturers of AFCIs use various noise sensing and processing techniques to establish when there is a high probability of arcing in a circuit. With respect to the "Trip Bucket" data, in the exemplary embodiment, this is a variable that the microcontroller 10 increments whenever the arc detection criteria is met; when the arc detection criteria is not met, the variable is gradually decremented to zero. The vertical lines shown in FIG. 2 represent a level at which miniature circuit breaker 2 will trip. Microcontroller 10 was programmed to interleave the "trip level" with the "trip bucket" value to give the observer some sense of scale. The term "trip bucket" comes from an analogy of a leaky bucket. If water flows in faster that it flows out, eventually the bucket will overflow. In this example, the point at which the bucket overflows with water is analogous to the point where miniature circuit breaker 2 will trip in response to an inferred arcing condition. The "leaky bucket" principal is used to insure that the inferred arcing condition persists for some period of time, which establishes a higher confidence that there is actually an arcing condition, and also helps insure that miniature circuit breaker 2 does not trip on a brief noise transient. In the illustrated exemplary embodiment, the "trip bucket" is incremented whenever there is sufficient line current ("i(t)") and sufficient high frequency noise ("HF"), and is decremented to zero otherwise. When the level of the "trip bucket" reaches the "trip level", miniature circuit breaker 2 trips.

EXAMPLE 3

The example miniature circuit breaker 2 can also provide improved diagnostics and logging of mechanical trips. For example, some trip functions (e.g., thermal-magnetic; instantaneous trips) are provided by mechanical mechanisms, which operate independently of, for example, AFCI electronics and provide no feedback thereto. Hence, the AFCI electronics design has no way to directly distinguish between the following events: (1) a magnetic instantaneous mechanical trip occurs; (2) a thermal mechanical trip occurs; (3) the user turns off the circuit breaker 2; and (4) the utility power goes out. If miniature circuit breaker 2 stores a record of several half-cycles of line current magnitudes, then it can infer either a thermal trip (e.g., relatively many half-cycles of moderately high current) or a mechanical instantaneous trip (e.g., about one or two half-cycles of relatively very high current) and distinguish these events from a user-initiated mechanical turn-off. The inferred trip information could be stored in a trip log. If desired, it could be indicated to a user (e.g., via an LED blink pattern or another suitable communications mechanism). As a further example, if miniature circuit breaker 2 infers thermal and magnetic trips fairly accurately, then perhaps other, benign events (e.g., without limitation, user turnoff; loss of utility line voltage) can be inferred by the process of elimination. However, since user turn-off and voltage outage are benign conditions, identifying them is less critical.

EXAMPLE 4

Load monitoring can also be provided if miniature circuit breaker 2 has a sense of time and captures line current and voltage information for its protective function(s). This information could also be used for monitoring and trend-logging of circuit utilization and performance. Some examples include: (1) total kilowatt-hours that were delivered through the circuit breaker 2 during its operational life span (if the total kilowatt-hours and the total operating time are known, then this can provide an estimated average loading of the circuit breaker); (2) a more detailed record of the loading of the power circuit (e.g., without limitation, over the operational life span of the circuit breaker 2, the number of line half-cycles when the circuit breaker was loaded from, for example, 0-25%, 25-50%, 50-75%, 75-100%, and over 100% of rated current); (3) a trend of kilowatt-hours for each hour over an interval of time (e.g., without limitation, kilowatt-hours consumed per hour for the last twenty-four hours); (4) power factor information (since the microcontroller 10 knows the approximate line voltage magnitude and the magnitude and phase of the current); (5) peak values of utility line voltage and line current over the life span of the circuit breaker 2; and (6) this type of load monitoring could lead to some unusual "protective" functions, such as, for example, miniature circuit breakers that trip after a fixed number of kilowatt-hours, or if the average power factor fell below a predetermined value for a predetermined period of time.

Thus, as demonstrated above, the disclosed miniature circuit breaker 2 is able to collect a wide range of information about the protected power circuit in order to make trip decisions. For example and without limitation, such information can include line current, high frequency activity, line voltage magnitude, and phase angle. The disclosed non-volatile memory 42 (e.g., without limitation, FRAM; magnetoresistive random-access memory (MRAM); non-volatile SRAM (nvSRAM); phase-change random-access memory (PRAM); conductive bridging RAM (CBRAM); SONOS (Silicon-Oxide-Nitride-Oxide-Silicon) memory; resistive random-access memory (RRAM)) can thus be employed to implement a "black box". Data stored in the "black box" can greatly improve diagnoses of issues in the field.

Figure 3:
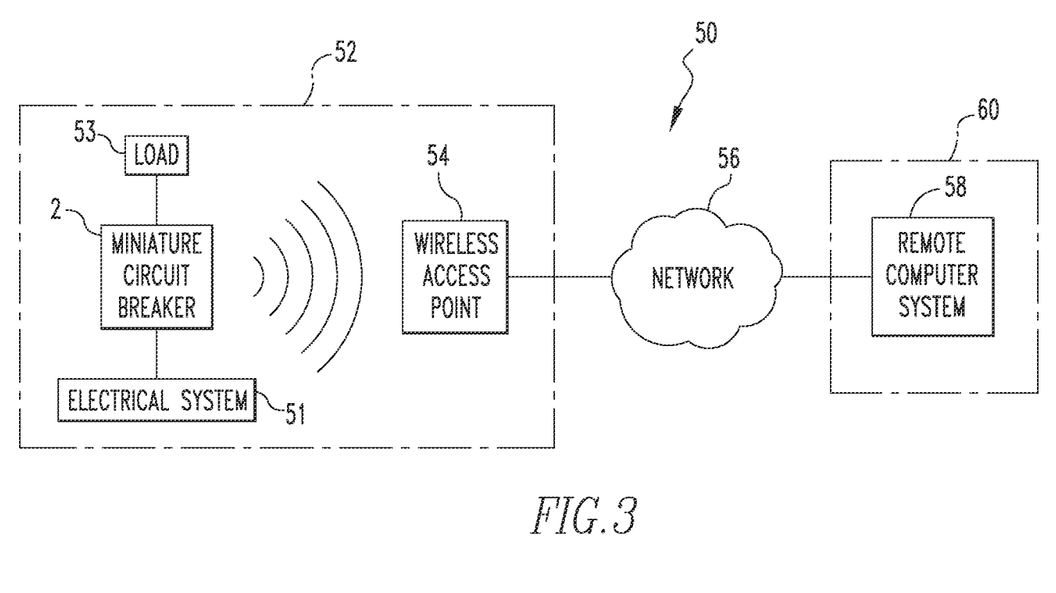
FIG. 3 is a block diagram of a remote diagnostic system for diagnosing issues associated with a circuit breaker trip occurring in the field from a remote location according to one exemplary embodiment of the disclosed concept.

FIG. 3 is a block diagram of a remote diagnostic system 50 for diagnosing issues associated with a circuit breaker trip occurring in the field from a remote location. As seen in FIG. 3, remote diagnostic system 50 includes miniature circuit breaker 2 as described in detail above, which in the exemplary embodiment is in the form of an AFCI. Miniature circuit breaker 2 is installed and in operation at a customer location 52, such as a residence, wherein it is coupled to an electrical system 51 (e.g., a utility AC power system) at the customer location 52 and provides protection for a load 53 (that may include one or more branch electrical circuits) at the customer location 52. Also located at customer location 52 is a wireless access point 54, which in the exemplary embodiment is a WiFi router configured for operation according to the Institute of Electrical and Electronics Engineers (IEEE) 802.11 standards. Wireless access point 54 is operatively coupled to a network 56 to provide data communications functionality between network 56 and miniature circuit breaker 2 (via short range wireless communications module 44 as described herein). Network 56 may be one or more wired and/or wireless communications networks alone or in various combinations, and may include, without limitation, the Internet. Finally, remote diagnostic system 50 also includes a remote computer system 58 located at a remote location 60 (remote from customer location 52). In the exemplary embodiment, remote computer system 58 includes a number of server computers configured to operate as a web server and a number of associated database components for storing data. Also in the exemplary embodiment, remote computer system 58 and remote location 60 are associated with the manufacturer of miniature circuit breaker 2 so that information stored therein may be accessed by designers/developers or other personnel of the manufacturer involved in circuit breaker diagnostic activities.

In operation, as described in detail herein, miniature circuit breaker 2 will store in non-volatile memory 42 certain data relating to any of a number of trip events. Such data may include, without limitation, line current, high frequency activity, line voltage magnitude, and phase angle data prior to a trip event, the "oscilloscope"-like data prior to a trip event as described herein, or any other trip event related and/or sensed power circuit information described herein. When miniature circuit breaker 2 is reset following a trip event, a predetermined amount (e.g., 250 milliseconds worth) of the data stored in non-volatile memory 42 prior to the trip event in question is automatically transmitted by miniature circuit breaker 2 to remote computer system 58 over network 56 for storage thereby.

Once the trip event data is stored by remote computer system 58, it may then be selectively accessed by developers or other personnel of the manufacturer in order to diagnose issues occurring at customer location 52. For example, and without limitation, the stored trip event data may be accessed using a computing device, such as a PC, a laptop computer, a tablet computer, or a smartphone, and a web interface. In one particular implementation, the stored trip event data, such as the "oscilloscope"-like data described herein, may be presented in graphical form.

Figure 4:
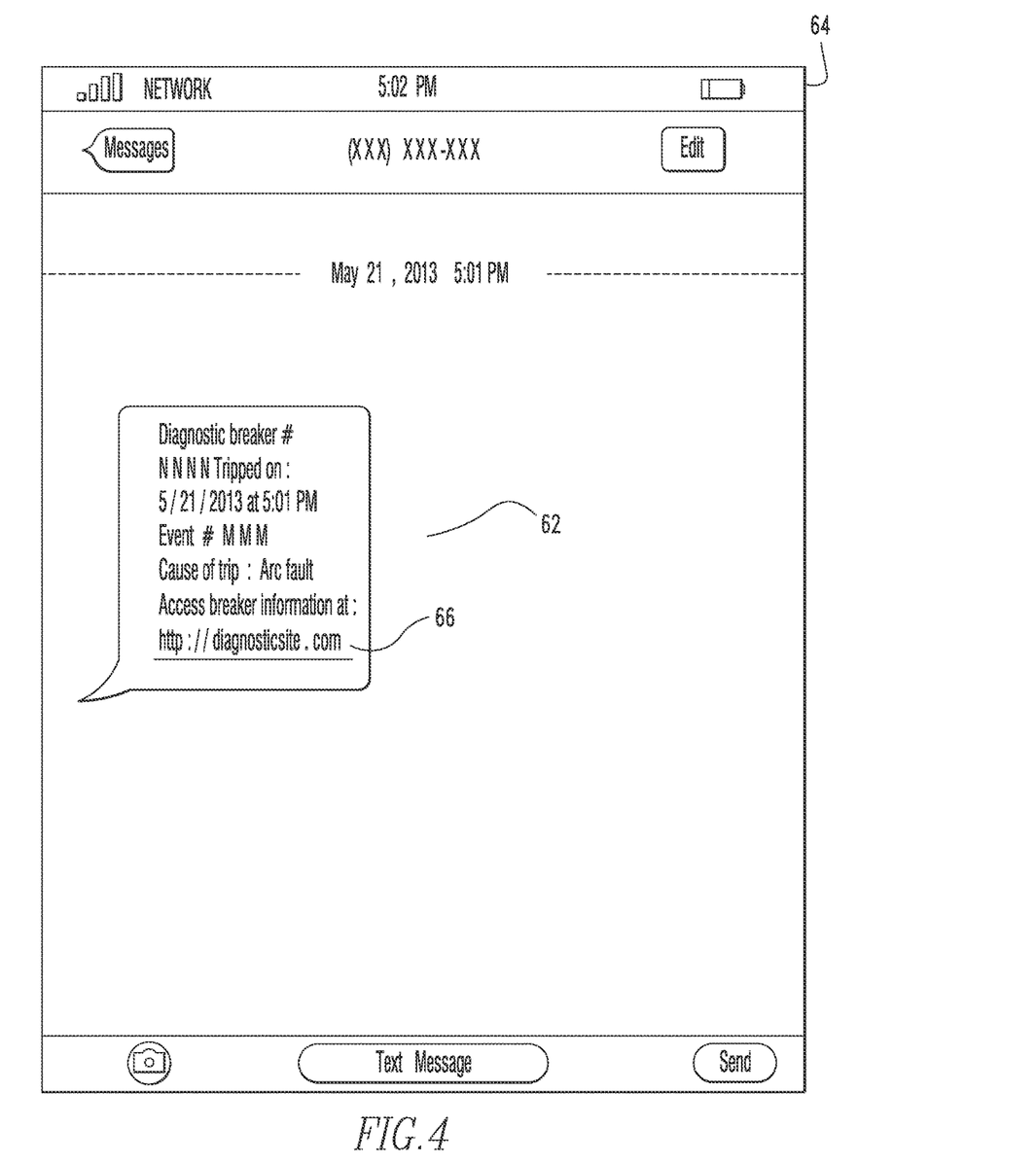
FIG. 4 is a schematic diagram of a text message generated by the remote diagnostic system of FIG. 3 according to one particular exemplary embodiment.
Figure 5:
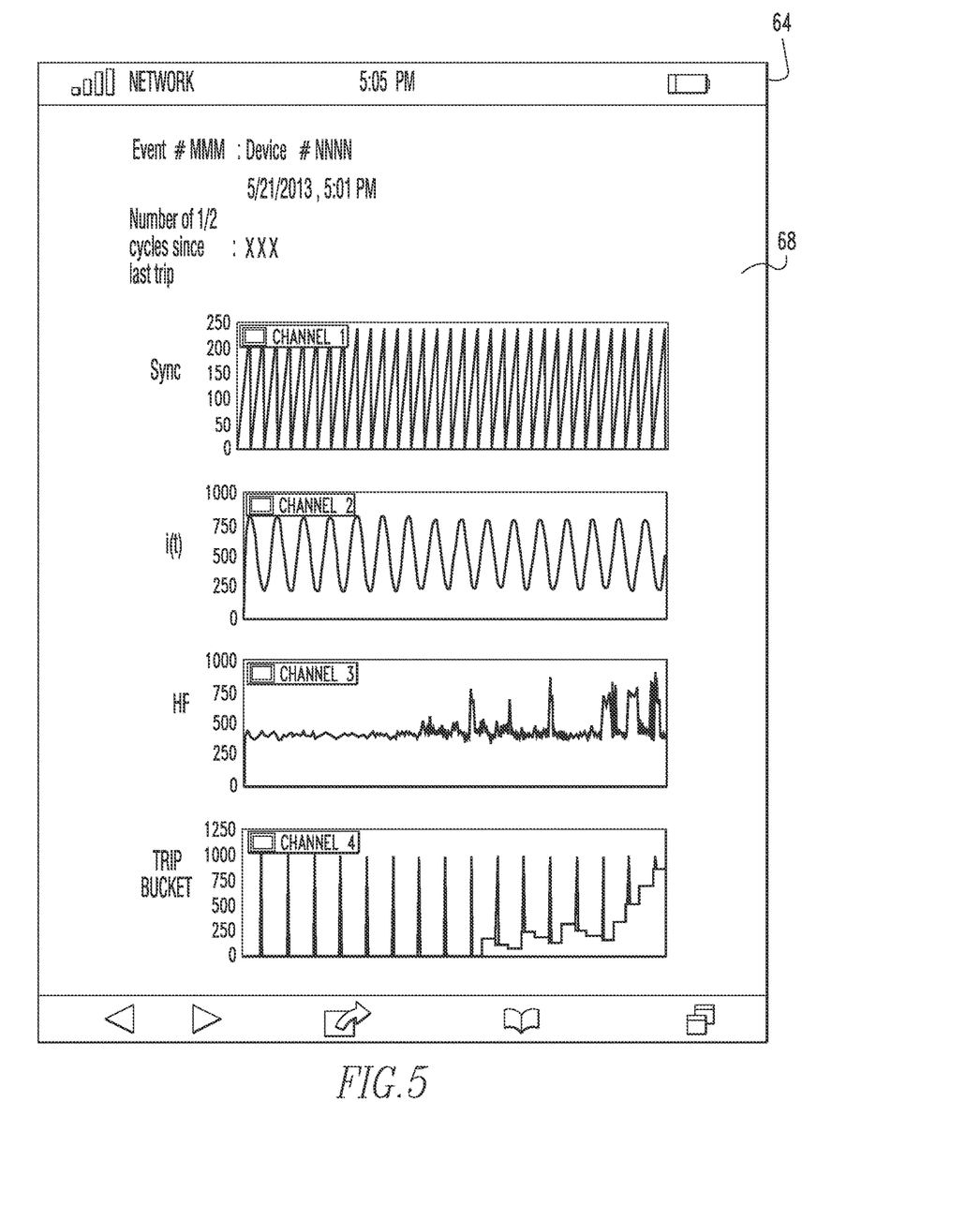
FIG. 5 is a schematic diagram of a web page generated by the remote diagnostic system of FIG. 3 according to one particular exemplary embodiment.

In one particular exemplary embodiment, miniature circuit breaker 2 is configured such that, when it transmits the data stored in non-volatile memory 4 as just described, it will also send an electronic message, such as a text message (SMS or MMS) or an email, to one or more designated individuals associated with the manufacturer (a developer or other diagnostic personnel of the manufacturer) that informs that individual that the trip event has occurred and that data relating thereto may be accessed thorough remote computer system 58. One example of such a text message 62 displayed on a screen 64 of a smartphone or similar computing device (e.g., a tablet computer) is shown schematically in FIG. 4. As seen in FIG. 4, such a text message 62 will include certain information about the event (e.g., breaker ID number, and data and time of event) and a hyperlink 66 to a web page 68 (FIG. 5) generated by remote computer system 58 which is configured to display the data in, for example, graphical form. Alternatively, such an electronic message may be generated and transmitted by remote computer system 58 in response to receipt of the data.

Figure 6:
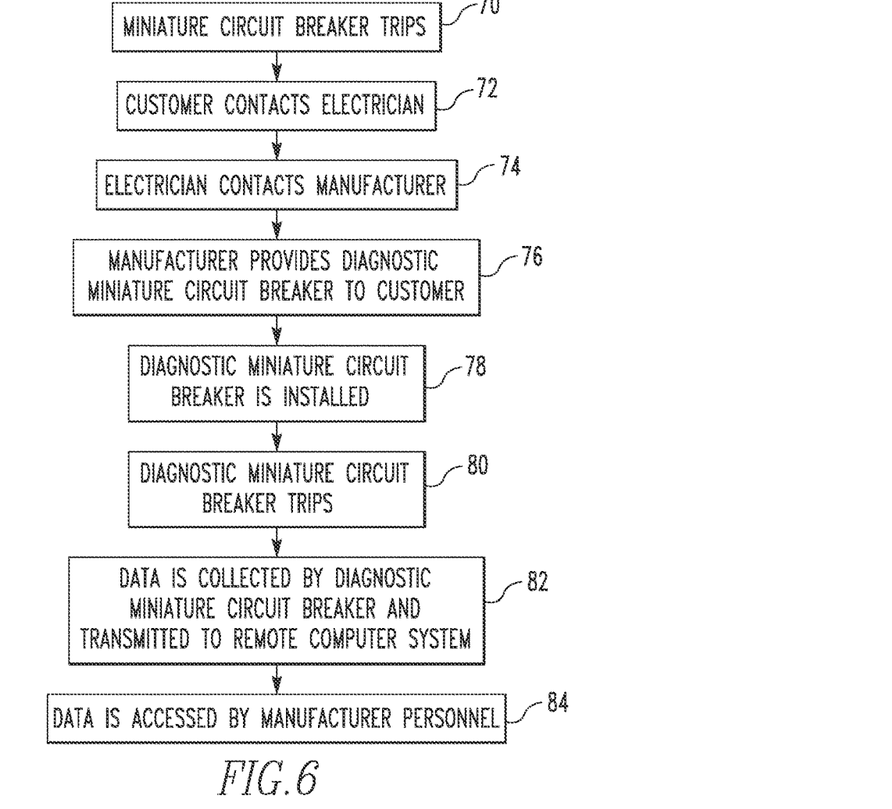
FIG. 6 is a flowchart illustrating a method of remotely diagnosing field issue associated with a trip of a miniature circuit breaker according to one exemplary embodiment of the disclosed concept.

FIG. 6 is a flowchart illustrating a method of remotely diagnosing field issues associated with a trip of a miniature circuit breaker according to one particular embodiment. The method will be described in connection with certain components of the remote diagnostic system 50 shown in FIG. 3 and described in detail elsewhere herein. The method begins at step 70, wherein the existing miniature circuit breaker of a customer at customer location 52 that is connected to electrical system 51 and the load 53 thereof experiences a trip event for which the customer has a concern. For example, the customer may be worried that the trip occurred as a result of a hazardous electrical condition at customer location 52 (i.e., a hazardous electrical condition within electrical system 51 and/or load 53 that may jeopardize load 53). A hazardous condition could also jeopardize the physical structure of customer location 52, for example by starting a fire. Next, at step 72, the customer contacts an electrician regarding his or her concerns. Then, in the present embodiment, rather than paying an immediate visit to customer location 52, the electrician instead, at step 74, contacts the manufacturer of miniature circuit breaker 2 to request a diagnostic breaker in the form of miniature circuit breaker 2 for use at customer location 52. At step 76, the manufacturer sends a miniature circuit breaker 2 to the customer and, at step 78, the electrician installs miniature circuit breaker 2 at customer location 52 for diagnostic purposes. Next, at step 80, miniature circuit breaker 2 trips (likely due to the same condition that caused the earlier trip that caused the customer concern). As described elsewhere herein, at step 82 (following step 80), certain pre-trip data is collected by miniature circuit breaker 2 and stored in the non-volatile memory 42 thereof. As described elsewhere herein, and as part of step 82, when miniature circuit breaker 2 is reset, the stored pre-trip data for a certain amount of time prior to the trip event is transmitted to remote computer system 58 over network 56. In the exemplary, non-limiting embodiment, that data includes the "oscilloscope"-like data shown in FIG. 2 for a predetermined amount of time prior to the trip (although it will be understood that this is exemplary only and that any combination of other types of data described herein may be stored within the scope of the present invention). Also in the exemplary, non-limiting embodiment, that data is transmitted to remote computer system 58 over network 56 using short range wireless communications module 44 and wireless access point 54 as described herein. It will be appreciated, however, that other methods of communication of the data to remote computer system 58 over network 56 may also be employed. For example, miniature circuit breaker 2 may be provided with a long range wireless communications module (such as a modem) to enable miniature circuit breaker 2 to communicate with remote computer system 58 over network 56.

Next, at step 84, the data transmitted to remote computer system 58 as just described is accessed by personnel of the manufacturer of miniature circuit breaker 2, such as a designer/developer or diagnostic technician, and used by that person to attempt to diagnose the field issue, if any, occurring at customer location 52. As described elsewhere herein, this step may involve the generation and transmission of an electronic message (by miniature circuit breaker 2 and/or remote computer system 58), such as text message 62 (FIG. 4), to the manufacturer personnel to facilitate access of the data in a form such as web page 68 using, for example, a smartphone, a tablet computer, a PC or a laptop computer.

Thus, the method of FIG. 6 as just described provides an improved method of diagnosing field issues associated with miniature circuit breakers that eliminates the need to send a costly design engineer to a field location in order to collect firsthand information about the issue. Rather, data for diagnosing the field issue is automatically transmitted to a remote location for ready access by appropriate personnel.

In the embodiment just described, the information stored in the non-volatile memory 42 of miniature circuit breaker 2 is in response to a trip/reset event. In an alternative embodiment, the information stored in the non-volatile memory 42 of miniature circuit breaker 2 is instead transmitted in response to a user request rather than in response to a trip/reset event. In particular, in one example of this embodiment, a web page is generated and made available by remote computer system 58 that allows a user to issue a request for information (such as the "oscilloscope"-like data shown in FIG. 2 for a predetermined amount of time) to miniature circuit breaker 2 by, for example, using a mouse to press a virtual button on the web page. The request is transmitted via network 56 the wireless communications module 44, which, as described elsewhere herein, may be the hardware module commercially available from Electric Imp, which momentarily changes the state of a digital output of wireless communications module 44. Microcontroller 10, which in this embodiment continually polls this digital output of wireless communications module 44, notes that it has changed state and then jumps to the steps/routine that causes the information stored non-volatile memory 42 to be transmitted to wireless communications module which in turn transmits the information to remote computer system 58 as described for subsequent output as also described herein. Thus, the actions of the microcontroller 10, wireless communications module 44 and the subsequent graphical display web page (e.g., web page 68) are the same as in the previously described embodiments (FIGS. 1-6), except that the event that initiates information transmission is a command transmitted via the web rather than manual reset of a breaker.

This alternative embodiment thus contemplates a very simple form of two-way communication, where miniature circuit breaker 2 is capable of receiving as well as transmitting data. In addition, in a further expansion of this alternative embodiment, more elaborate forms of two-way communication are also possible. For example, miniature circuit breaker 2 could receive commands and data from the network 56 to trip on demand, change setpoints, enable and disable certain protection functions, reprogram itself, etc.

In another alternative embodiment, the information stored in the non-volatile memory 42 of miniature circuit breaker 2 is transmitted periodically in response to the timeout of a timer. So, one would set up a timer in miniature circuit breaker 2 that would time out periodically and prompt miniature circuit breaker 2 to transmit its data to remote computer system 58 as described herein.

Figure 7:
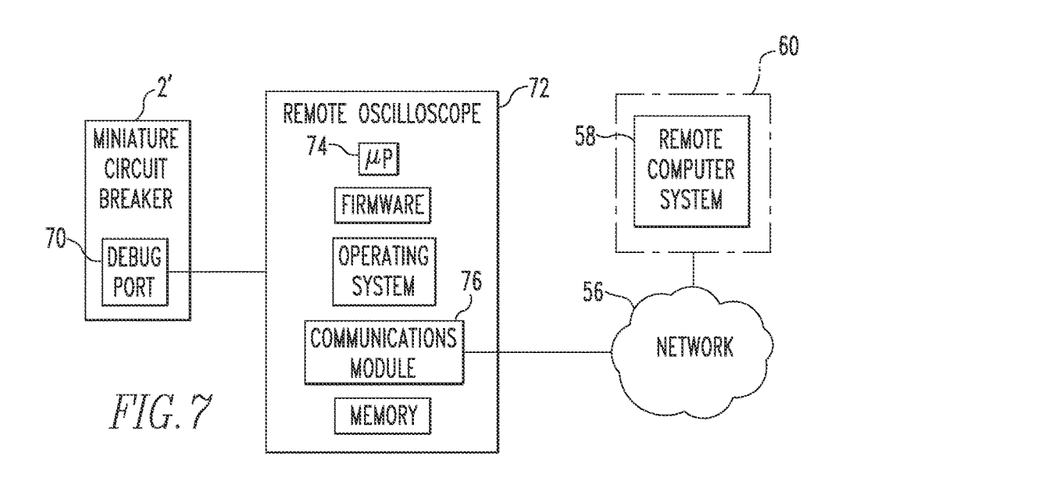
FIG. 7 is a block diagram of a remote diagnostic system for diagnosing issues associated with a circuit breaker trip occurring in the field from a remote location according to an alternative exemplary embodiment of the disclosed concept.

In another alternative embodiment, shown schematically in FIG. 7, a modified version of miniature circuit breaker 2, labeled 2', is provided at the customer location. The miniature circuit breaker 2', rather than having short range wireless communications module 44 integrated therein, is provided with a debug port 70. The debug port 70 is structured to allow a separate electronic device that includes the functionality of short range wireless communications module 44 as described herein to be plugged into it so that the data described herein can be provided to that separate electronic device and then transmitted to network 56 and beyond as described herein. In FIG. 7, that separate electronic device is shown as remote oscilloscope 72. Thus, in this embodiment, at step 76 of FIG. 6, rather than the manufacturer sending a miniature circuit breaker 2 to the customer, the manufacturer will instead send this separate electronic device (remote oscilloscope 72) to the customer. The customer will then plug that device into the debug port 70 of miniature circuit breaker 2' and data will be collected and transmitted for diagnostic purposes as described elsewhere herein (e.g., steps 82 and 84).

In one non-limiting, exemplary embodiment, the separate electronic device just described (remote oscilloscope 72) is a small, portable electronic device that includes the hardware module commercially available from Electric Imp and that is built on the Electric Imp platform as described herein. The Electric Imp is a module containing a 32-bit Cortex M3 processor (μp 74) with built in WiFi or cellular communication (communications module 76) for connecting to Electric Imp's cloud services. In the cloud (network 56), a virtual imp or agent handles HTTP(S) internet traffic and can perform web tasks such as hosting a webpage and securely communicating data to other cloud services such as a database provided at remote location 60. The hardware is capable of sampling 8 different 0-3.3 V signals. Due to memory/processing limitations and network latency issues, the maximum sustainable sampling rate in this exemplary embodiment is a single 8 kHz signal streamed to the cloud or a continuous running RMS value at 48 kHz. The hardware is limited to non-simultaneous sampling and the maximum sampling frequency is 2 MHz, so samples across multiple channels are separated by 0.5 microseconds. Despite these limitations, the separate electronic device (remote oscilloscope 72) just described is still a very capable oscilloscope. The signals themselves or additional digital input pins on the Electric Imp can be used as triggers and data can be sent to the cloud whenever an event occurs. In one implementation, four channels are sampled at 500 Hz. The Electric Imp is capable of streaming this data to the cloud and to a browser through an agent hosted webpage in real time. To conserve cellular data usage and minimize database storage, a digital input is also connected to a breaker trip signal from miniature circuit breaker 2'. Even when not streaming data to the cloud, the Electric Imp hardware is constantly sampling and stores a 4 second buffer of data in memory. When a trip occurs, this data (plus up to one second after the trip) is sent to the cloud and a notification email (or other form as described herein) is sent to engineering personnel to analyze the cause of trip. This method guarantees that trip events are always captured into a cloud database (e.g., at remote computer system 58).

Finally, the functionality described herein can be an invaluable tool during product development. By incorporating the functionally into beta units (e.g., building beta units a miniature circuit breakers 2), product can be shipped and tested at facilities and homes around the world. Data can be collected and evaluated by the product engineer without any travel or unutilized time. Cloud algorithms can help aggregate and evaluate data, pointing to the most common issues and help to focus resources on the most important issues. If firmware issues are discovered, the device firmware can be upgraded via the cloud and then reevaluated. This level of capability extends product development and testing from inside the lab out into the field and allows engineers to discover problems before full-scale production or selling into the market has occurred, which can prevent costly recalls.

While the embodiments provided above are described in connection with a miniature circuit breaker, it will be understood that the disclosed concepts may also be implemented in connection with other types of circuit protection devices (i.e., circuit interrupters), such as, without limitation, AFCI receptacles, larger commercial circuit protection devices, or any other circuit protection device that operates using electronics, microprocessors and firmware.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of remotely diagnosing field issues associated with a trip of a circuit protection device at a customer location, comprising:
   receiving at a location remote from the customer location a notice of a potential field issue at the customer location;
   responsive to and triggered by receiving the notice, causing from the remote location a diagnostic circuit protection device to be provided to and installed at the customer location between an electrical system and a load having one or more branch electrical circuits, wherein the diagnostic circuit protection device includes a processor coupled to a plurality of sensors, wherein the plurality of sensors include: (a) a noise sensor coupled to a high frequency noise detection circuit, (b) a current sensor coupled to a line current sensing circuit, and (c) a line-to-neutral voltage sensing and zero crossing detector circuit, wherein the plurality of sensors and the processor are together structured to sense and determine power circuit information associated with one or both of the electrical system and the one or more branch electrical circuits after the diagnostic circuit protection device is installed at the customer location, and a non-volatile memory;
   inputting and storing the power circuit information and determining and storing trip information for one or more trip cycles of the diagnostic circuit protection device in the non-volatile memory, wherein the power circuit information includes: (i) synch data representing microcontroller interrupts for each half cycle of a utility sinusoidal voltage, (ii) i(t) data representing current on the one or more branch electrical circuits, (iii) HF data representing high frequency noise on the one or more branch electrical circuits, and (iv) trip bucket data representing a variable that is incremented whenever certain predetermined arc criteria for one or both of the electrical system and the one or more branch electrical circuits is met and that is incremented whenever the certain predetermined arc criteria is not met; and
   transmitting the stored power circuit information and trip information to a remote computer system, the stored power circuit information and trip information being stored by the remote computer system for subsequent access thereto for diagnosing the potential field issue.

2. The method according to claim 1, wherein the circuit protection device is a miniature circuit breaker and the diagnostic circuit protection device is a diagnostic miniature circuit breaker.

3. The method according to claim 1, wherein the transmitting step is performed in response to the diagnostic circuit protection device experiencing a trip event.

4. The method according to claim 1, wherein the transmitting step is performed in response to the diagnostic circuit protection device receiving an information request over a network.

5. The method according to claim 1, wherein the transmitting step is performed in response to expiration of a timer in the diagnostic circuit protection device.

6. The method according to claim 1, wherein the diagnostic circuit protection device includes a wireless communications module coupled to the non-volatile memory, wherein the transmitting comprises at least partially wirelessly transmitting the stored power circuit information and trip information to the remote computer system.

7. The method according to claim 6, wherein the wireless communications module comprises a short range wireless communications module.

8. The method according to claim 7, wherein the short range wireless communications module includes a processor and a wireless radio.

9. The method according to claim 1, further comprising transmitting the stored power circuit information and trip information from the remote computer system to a computing device associated with an individual responsible for diagnosing the potential field issue.

10. The method according to claim 3, further comprising transmitting an electronic message to a computing device associated with an individual responsible for diagnosing the potential field issue, the electronic message indicating that the diagnostic circuit protection device experienced the trip event and that the stored power circuit information and trip information is available from the remote computer system for diagnosing the potential field issue.

11. The method according to claim 10, wherein the electronic message is a text message or an email.

12. The method according to claim 11, wherein the electronic message includes a hyperlink structured to enable the stored power circuit information and trip information to be displayed on one or more web pages.

13. The method according to claim 1, further comprising employing the stored power circuit information and trip information to create a graphical output including one or more waveform diagrams, and causing the graphical output to be provided to a computing device associated with an individual responsible for diagnosing the potential field issue for subsequent display on the computing device.

* * * * *